(12) United States Patent
Lee

(10) Patent No.: US 6,333,221 B1
(45) Date of Patent: Dec. 25, 2001

(54) METHOD FOR IMPROVING PLANARIZATION OF AN ILD LAYER

(75) Inventor: Chiu-Te Lee, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 7 days.

(21) Appl. No.: 09/620,236

(22) Filed: Jul. 20, 2000

(51) Int. Cl.$^7$ .................................................. H01L 21/8242
(52) U.S. Cl. ........................ 438/239; 438/258; 438/256; 438/626
(58) Field of Search .................................. 438/239, 253, 438/254, 255, 621, 626, 632, 646, 258, 256

(56) References Cited

U.S. PATENT DOCUMENTS

| | | | |
|---|---|---|---|
| 5,300,814 | * | 4/1994 | Matsumoto et al. . |
| 5,405,800 | * | 4/1995 | Ogawa et al. . |
| 5,937,322 | * | 8/1999 | Matsuura . |
| 5,965,939 | * | 10/1999 | Kim et al. . |
| 6,060,349 | * | 5/2000 | Peng et al. . |
| 6,063,702 | * | 5/2000 | Chung . |
| 6,265,303 | * | 7/2001 | Lu et al. . |
| 6,265,778 | * | 7/2001 | Tottori . |

* cited by examiner

Primary Examiner—Tuan H. Nguyen
(74) Attorney, Agent, or Firm—Winston Hsu

(57) ABSTRACT

An improved embedded DRAM fabricating process is disclosed. The method includes first forming a first dielectric layer on the surface of a semiconductor wafer covering a memory region and a logic region that are previously defined on the semiconductor wafer, forming a conductive layer over the first dielectric layer, forming at least one dummy pattern over the logic region and a plurality of storage nodes over the memory region in the conductive layer, forming an insulating layer and a top electrode on each of the storage nodes, and forming a second dielectric layer on the surface of the semiconductor wafer that covers the top electrode and the dummy pattern. The second dielectric layer fills the spaces between the dummy pattern.

18 Claims, 7 Drawing Sheets

METHOD FOR IMPROVING PLANARIZATION OF AN ILD LAYER

BACKGROUND OF THE INVENTION

1. Field of the Invention

The present invention relates to a method of fabricating dynamic random access memory (DRAM), and more particularly, to a method for improving topography/planarization of an inter layer dielectric (ILD) layer during an embedded DRAM manufacturing process.

2. Description of the Prior Art

Dynamic random access memory (DRAM) devices are used extensively in the electronics industry for information storage. A high density DRAM, such as a 64 megabit DRAM, comprises millions of memory cells. Each memory cell on the DRAM chip comprises a pass transistor, e.g. a metal-oxide-semiconductor field-effect transistor (MOSFET), and a storage capacitor for storing charge. Embedded DRAM (EDRAM) is a type of integrated circuit (IC) that combines DRAM circuits and logic circuits together in a semiconductor substrate. Nowadays, the trend in manufacturing semiconductor ICs is to integrate memory cell arrays with high-speed logic circuit elements. For example, microprocessors or digital signal processors all have integrated circuits that incorporate embedded memory.

However, the prior method of fabricating EDRAM encounters a serious topographical problem of an ILD layer before a metallization process is carried out. More specifically, the prior method encounters a problem resulting from a large difference in height on the ILD layer between a memory region and a logic region on an EDRAM. The problem of this large step height difference becomes increasingly critical for the production yield.

The steps involved in manufacturing a conventional EDRAM on a semiconductor wafer 50 are illustrated in FIG. 1 to FIG. 8. Referring first to FIG. 1, the semiconductor wafer 50 comprises a silicon substrate 52 on which a memory region 10 and a logic region 12 are previously defined. The memory region 10 comprises capacitor structures 18a, 18b and gate structures 14, while the logic region 12 comprises a plurality of gate structures 15 on the silicon substrate 52. In the memory region 10, the capacitor structures 18a, 18b are formed on an atmospheric-pressure CVD oxide (AP oxide) layer 22 having an approximately even surface. The gate structures 14, 15 are covered by a phosphosilicate glass (PSG) layer 20. A plug 16 formed in the AP oxide layer 22 and the PSG layer 20 functions to electrically connect the capacitor structure 18a and the underlying source or drain (not explicitly shown) in the silicon substrate 52.

In FIG. 1, a borophosphosilicate glass (BPSG) layer 24 acting as a buffer layer, which covers both the memory region 10 and logic region 12, is first formed on the surface of the semiconductor wafer 50. Because of the capacitor structures 18a, 18b, the difference in height on the BPSG layer 24, between the memory region 10 and the logic region 12, can be as large as 6000 to 9000 angstroms. This large difference in height (step height) can cause difficulties in forming a contact window/plug in subsequent fabrication processes and results in a more complicated fabrication problem.

Referring to FIG. 2, a conventional anisotropic dry etching process is carried out to etch the BPSG layer 24 down to the surface of the AP oxide layer 22 so as to form a spacer 26 along the rim of the memory region 10. The spacer 26 is used to release surface stress of the semiconductor wafer 50 that occurs in subsequent processes. A PSG layer 32 with a thickness of about 3000 to 7000 angstroms is then deposited on the surface of the semiconductor wafer 50. Thereafter, a thermal re-flow process is performed to reduce the step height between the memory region 10 and the logic region 12 to an extent that the difference in height is about 4000 to 8000 angstroms.

Referring now to FIG. 3, using a conventional lithographic method, a patterned and developed photoresist layer 42 is formed on the semiconductor wafer 50 to leave exposed the memory region 10 in the BPSG layer 32. An etch back process is subsequently performed to etch away a predetermined thickness from the BPSG layer that is not covered by the photoresist layer 42, leaving the remaining BPSG layer 32 about 1000 angstroms thick over the memory region 10. A photoresist ashing process and a series of cleaning procedures are then carefully carried out to remove the photoresist layer 42 and obtain a clean semiconductor wafer surface.

In FIG. 5, a conventional chemical mechanical polishing (CMP) process is performed to planarize the BPSG layer 32. The CMP process must be carried out with extreme care to prevent breakthrough of the BPSG layer 32 over the capacitor structures 18a, 18b. Next, as shown in FIG. 6, a PSG layer 44 with a thickness of about 1000 angstroms is deposited using a conventional chemical vapor deposition technique to form a more even surface.

In FIG. 7, by means of a conventional lithographic technique and a dry etching process, a contact plug 46 is formed over in the PSG layer 44, AP oxide layer 22 and PSG layer 20 to the surface of the silicon substrate 52 over the logic region 12. The contact plug 46 is used to electrically couple with the subsequently formed upper layer metal and the underlying devices on the silicon substrate 52. Finally, as shown in FIG. 8, a metal layer 48 is formed atop the PSG layer 44, thereby completing the fabrication of a conventional EDRAM.

From the above, the prior method of fabricating EDRAM has the following drawbacks: (1) the spacer 26 used to release stress is required in the prior art process; (2) an additional BPSG layer 24 and an etching process are therefore needed to form the spacer 26; (3) an additional thick PSG layer 32 is required; (4) an additional thermal re-flow process is required to obtain a smoother PSG layer 32; (5) an additional lithographic process and an etching process are needed to remove a predetermined thickness of the PSG layer 32 over the memory region 10; and (6) an extra-expensive CMP process is also needed. Consequently, the prior art method of fabricating EDRAM is inefficient, time-consuming and costly.

SUMMARY OF THE INVENTION

It is therefore a primary objective of the present invention to provide a more economical method of fabricating EDRAM by simplifying the above-mentioned complicated and costly steps.

Another objective of the present invention is to provide a method of fabricating EDRAM that resolves the problem of large step heights between memory regions and logic regions.

Still another objective of the present invention is to provide a method of fabricating EDRAM so that a high degree of planarity in integrated circuits is maintained.

Still another objective of the present invention is to provide a planarization method on an EDRAM before metallization.

In a preferred embodiment according to the present invention, a memory region and a logic region are previously defined on a semiconductor wafer. The method includes first forming a first dielectric layer on the surface of the semiconductor wafer covering the memory region and the logic region, forming a conductive layer over the first dielectric layer, forming at least one dummy pattern over the logic region and a plurality of storage nodes over the memory region in the conductive layer, forming an insulating layer and a top electrode on each of the storage nodes, and forming a second dielectric layer on the surface of the semiconductor wafer that covers the top electrode and the dummy pattern. The second dielectric layer fills the space between the dummy pattern.

In accordance with one aspect of the present invention, the width of the spacing between the dummy pattern is less than half the thickness of the second dielectric layer so that the second dielectric layer can completely fill the spacing. Furthermore, to reduce the parasitic capacitance between the dummy pattern and the upper metal layer, an etch back process is performed to sharpen the dummy pattern after forming the dummy pattern.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
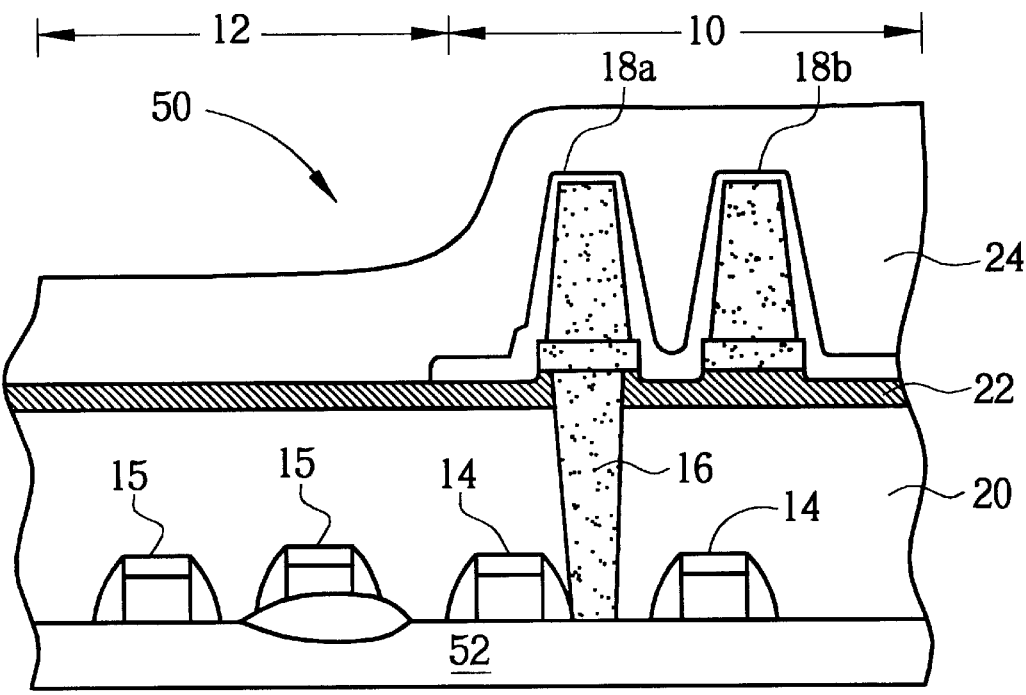
FIG. 1 to FIG. 8 are cross-sectional diagrams illustrating the steps involved in manufacturing a conventional EDRAM on a semiconductor wafer.
Figure 2:
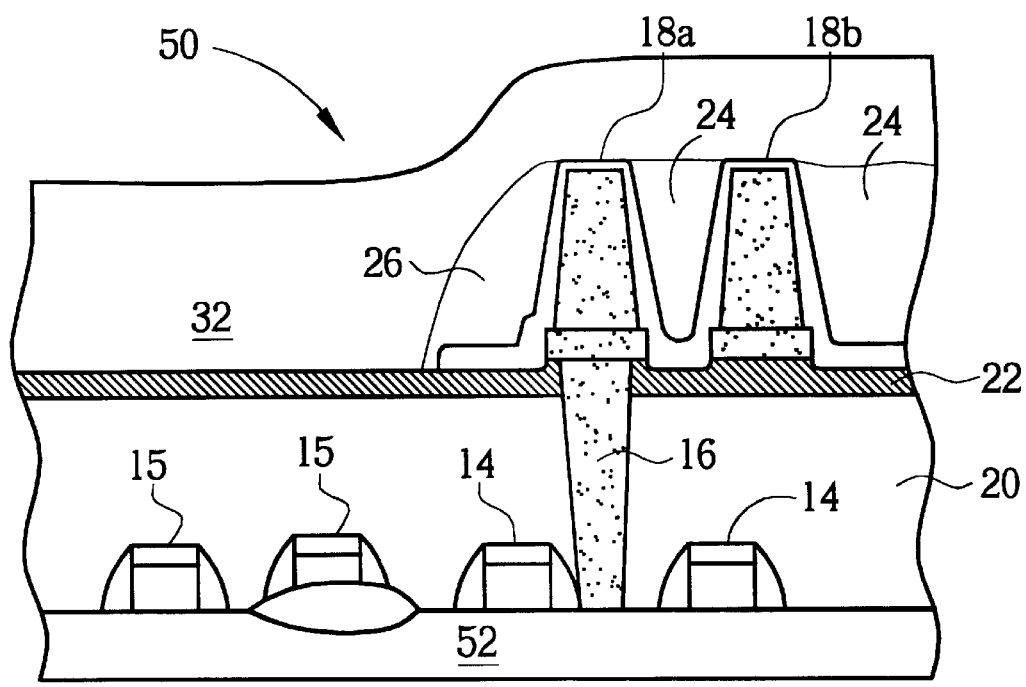
Figure 3:
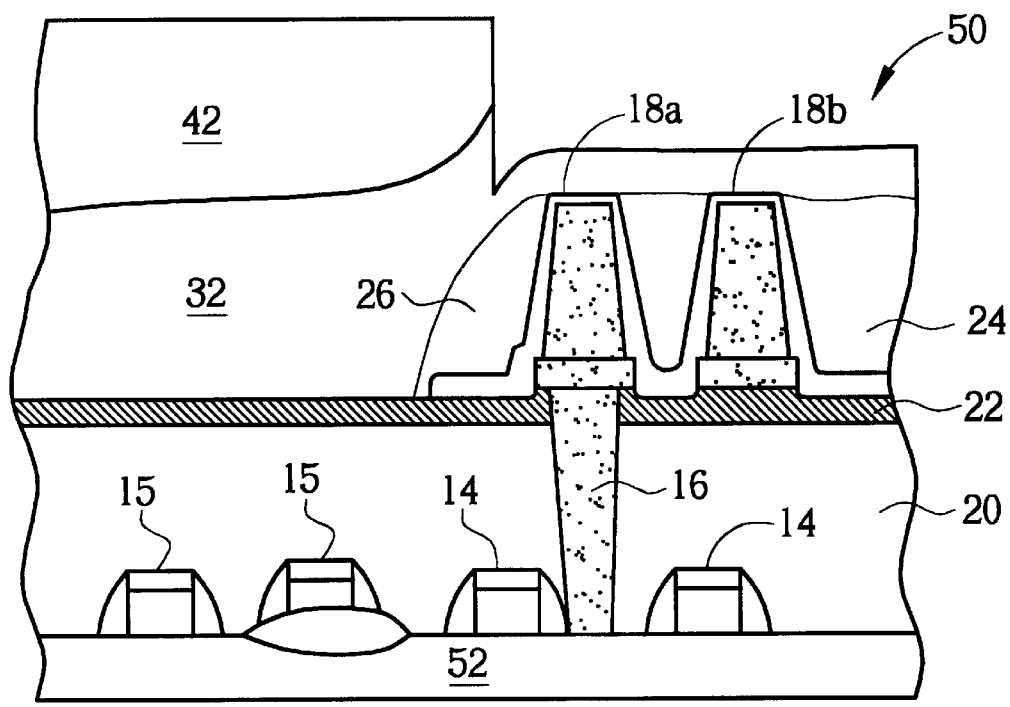
Figure 4:
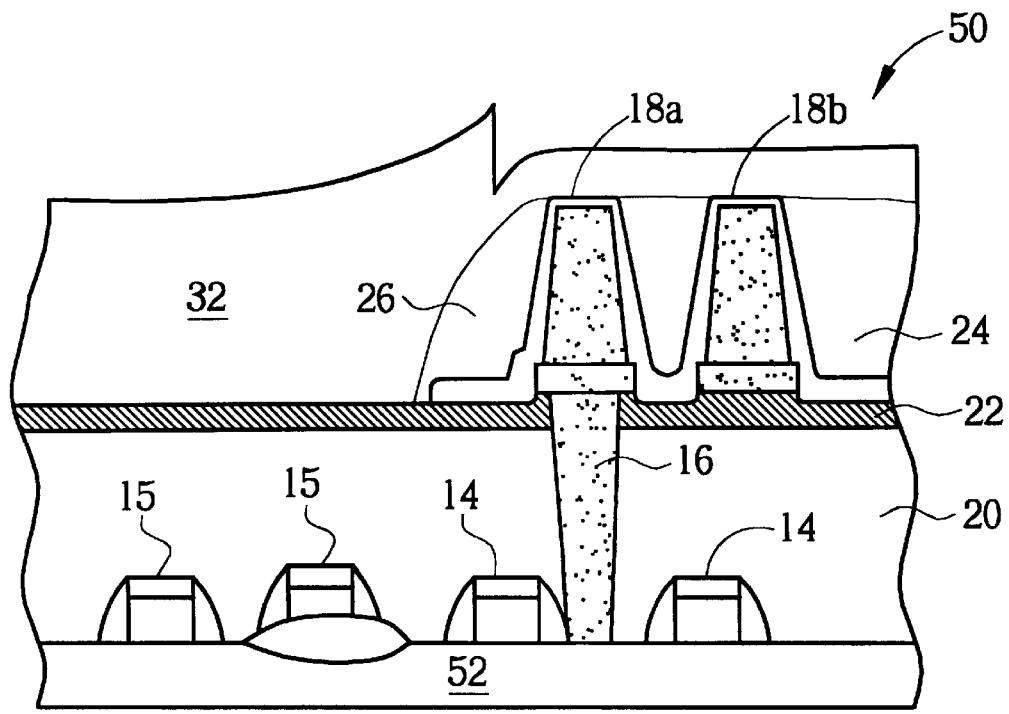
Figure 5:
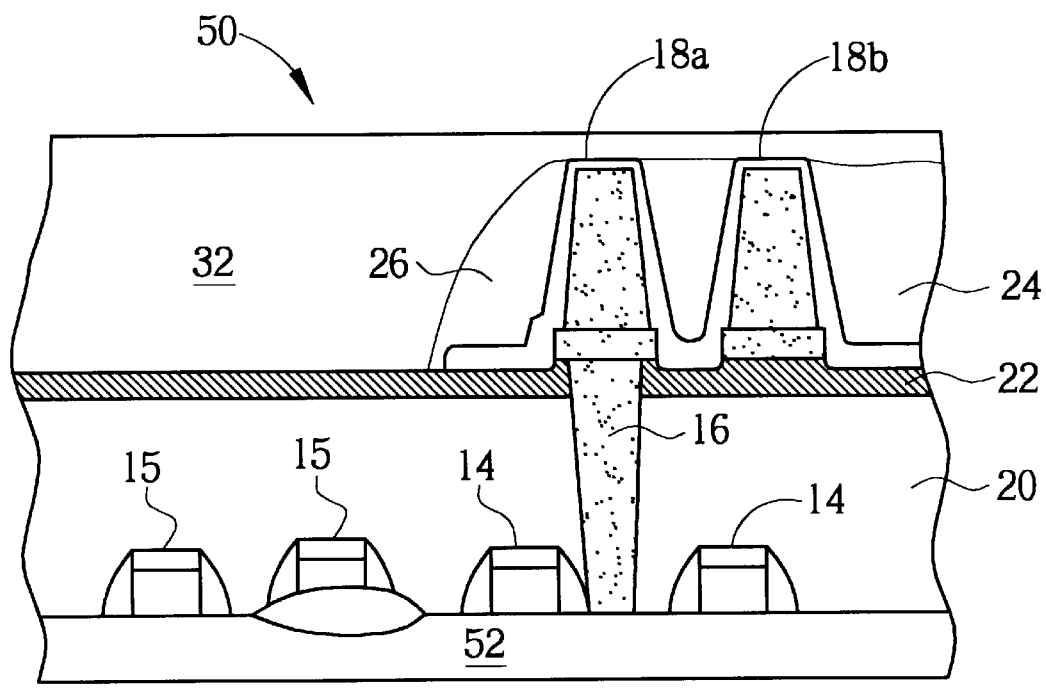
Figure 6:
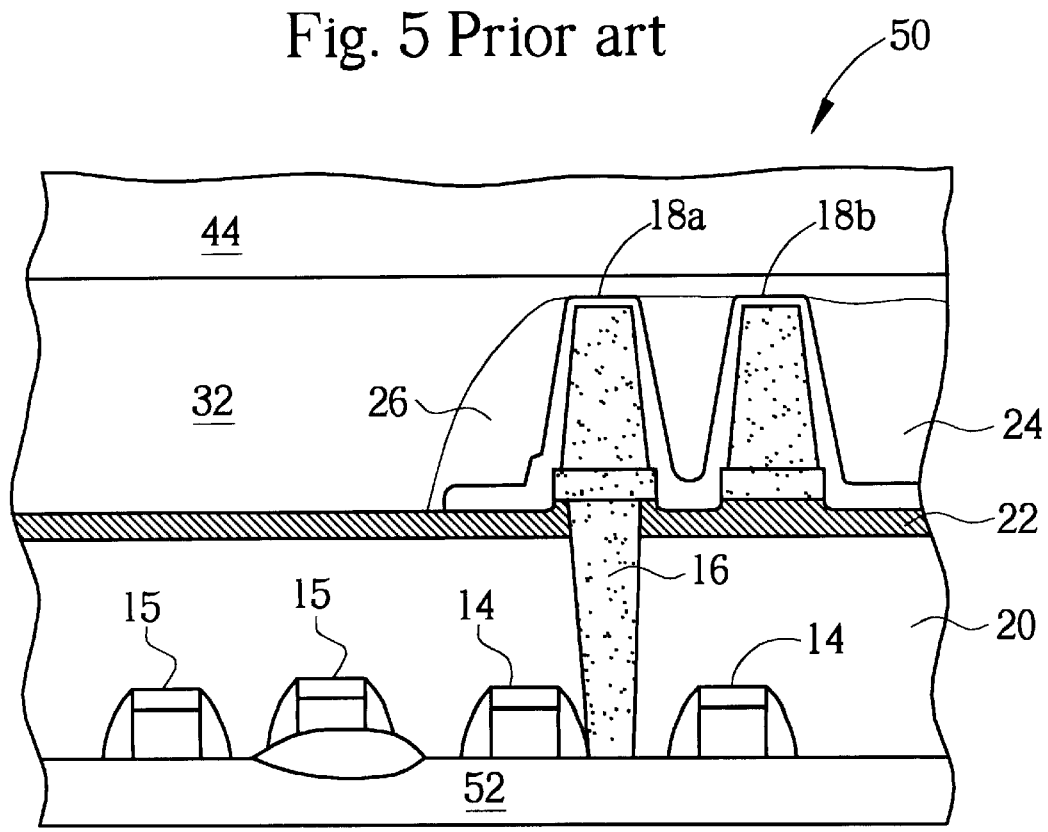
Figure 7:
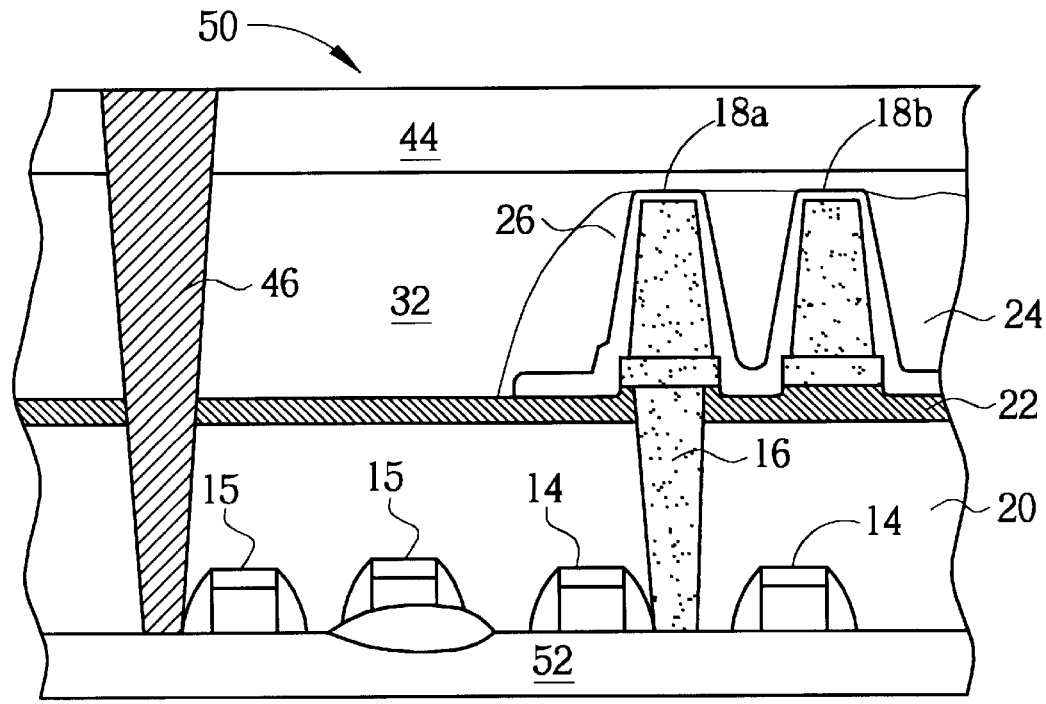
Figure 8:
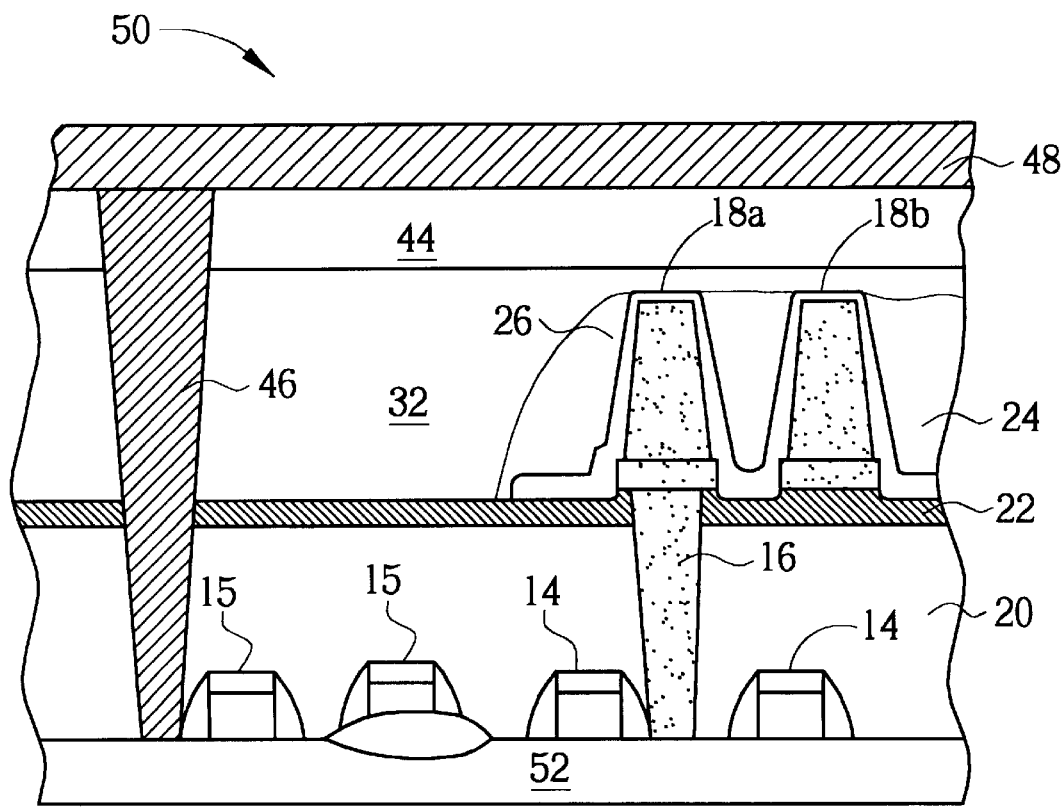
Figure 9:
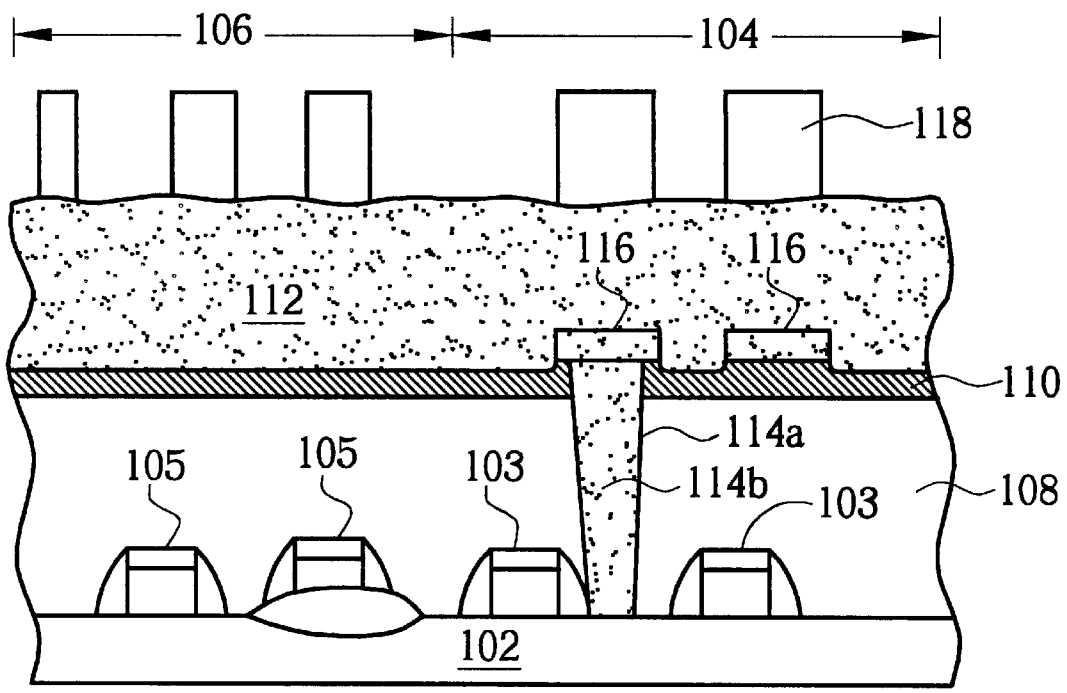
FIG. 9 to FIG. 13 are cross-sectional diagrams showing the fabricating method of EDRAM according to the present invention.

Please refer to FIG. 9 to FIG. 13. FIG. 9 to FIG. 13 are cross-sectional diagrams showing the fabricating method of EDRAM on a semiconductor wafer 100 according to the present invention. As shown in FIG. 9, the semiconductor wafer 100 comprises a substrate 102 on which a memory region 104 and a logic region 106 have been defined. The memory region 104 comprises a plurality of gate structures 103 while the logic region 106 comprises a plurality of gate structures 105 on top of the substrate 102. The gate structures 103, 105 are covered by a PSG layer 108 with a thickness of about 3000 to 7000 angstroms, which is formed by means of a conventional CVD process. Optionally, after forming the PSG layer 108, a CMP process is carried out to planarize it. On top of the PSG layer 108 is an approximately even AP oxide layer 110.

In FIG. 9, a conventional lithographic process and an etching process are first performed to create a contact hole 114a in the PSG layer 108 and AP oxide layer 110 over the memory region 104. Thereafter, a contact node 114b and a landing pad 116 atop the contact hole 114b are sequentially formed by filling the contact hole 114a with polysilicon, then depositing a layer of polysilicon, which are known techniques in the art.

A low pressure chemical vapor deposition (LPCVD) is next performed using silane ($SiH_4$) and phosphine ($PH_3$) as the main reacting gases to form a conductive layer 112 that consists of amorphous silicon and phosphorus. The thickness of the conductive layer 112 is about 6000 to 8000 angstroms. In another embodiment, the conductive layer 112 is composed of doped polysilicon or amorphous silicon. Subsequently, a patterned and developed photoresist layer 118 is formed on the surface of the conductive layer 112. The pattern in the photoresist layer 118 includes a dummy pattern 122 over the logic region 106 and a storage location pattern 120 over the memory region 104.

Figure 10:
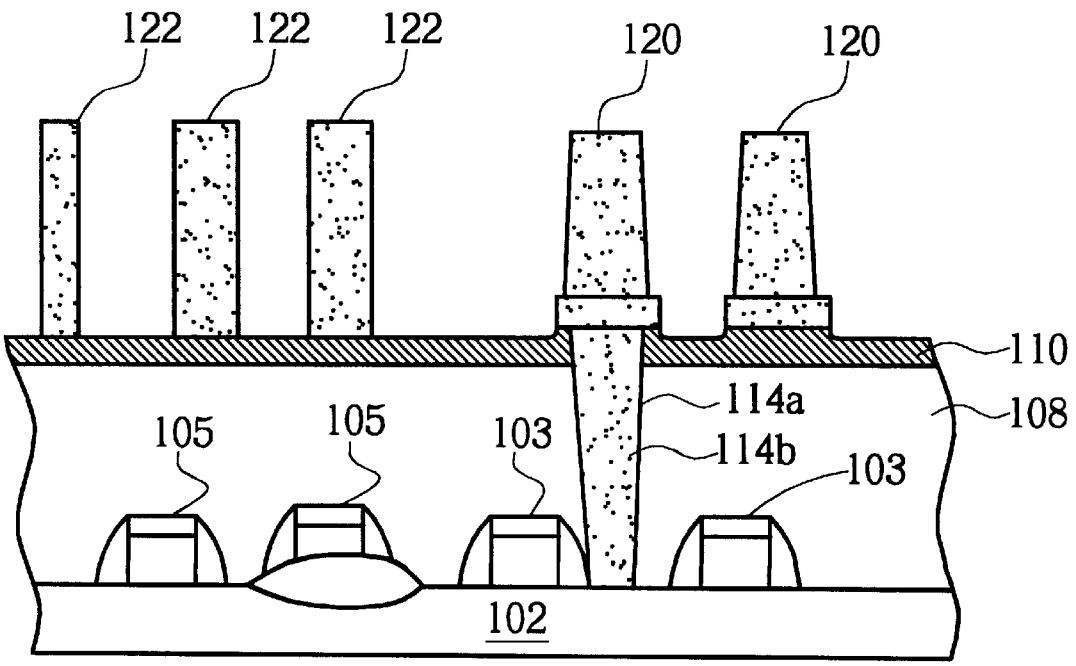

In FIG. 10, a dry etching process is then performed to transfer the pattern in the photoresist layer 118, which acts as a hard mask during the etching process, to the conductive layer 112. The conductive layer 112 that is not covered by the photoresist layer 118 is etched down to the surface of the AP oxide layer to respectively form a storage node 120 over the memory region 104 and a dummy structure 122 over the logic region 106. Since the storage node 120 and the dummy structure 122 are formed simultaneously in one step they are approximately flush with each other.

After completing the storage node 120, an ultra-high vacuum chemical vapor deposition (UHV CVD) process follows to form a polysilicon layer with a hemi-spherical grain (HSG) structure (not explicitly shown) on the exposed surface of the storage node 120 so as to increase the area on the storage node 120 for storing electric charge. In the UHV CVD process, the operating pressure of the vacuum chamber is below 1 torr and the operating temperature is between about 550 to 800 degrees Celsius. Subsequently, an annealing process in a nitrogen atmosphere is further used to drive the phosphoric atoms in the storage node 120 into the HSG polysilicon layer. This also transforms the storage node 120 into polysilicon.

Figure 11:
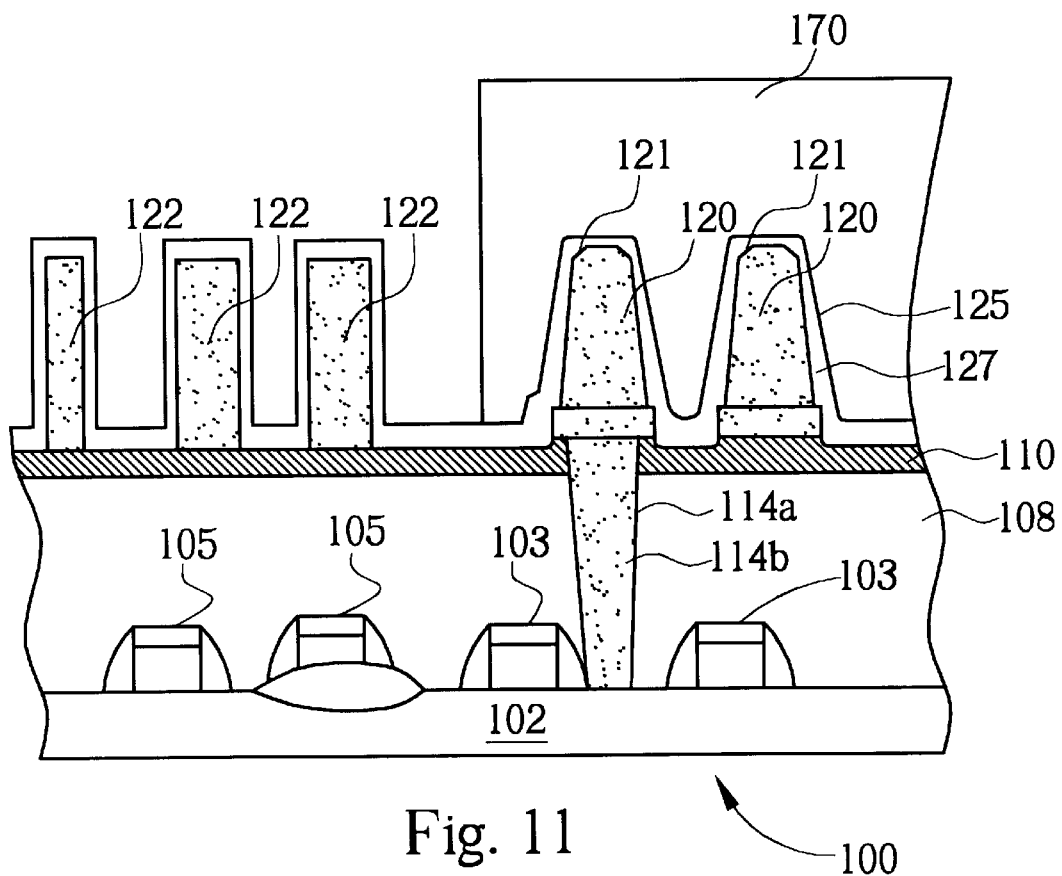

In FIG. 11, an ONO (oxidized-silicon nitride-silicon oxide) process is next performed to form a capacitor insulating layer 127, with a thickness that is between about 30 to 100 angstroms, on the storage node 120. In the ONO process, a native oxide layer (not shown) is first formed on the surface of the storage node 120 with a thickness of about 10 to 50 angstroms. Then, a plasma-enhanced CVD process, or an LPCVD process, is performed to form a silicon nitride layer (not shown) with a thickness of about 45 angstroms. A healing process is then performed to form a silicon oxy-nitride layer with a thickness between 40 to 82 angstroms over the silicon nitride layer. The native oxide, the silicon nitride layer and the silicon oxy-nitride layer form the capacitor insulating layer 127. The healing process is done in an oxygen-containing atmosphere at about 800 Celsius degrees for approximately 30 minutes. The silicon oxy-nitride layer is used to reduce the leakage current that results from defects in the silicon nitride layer. A conventional CVD process is performed to form a polysilicon conductive layer 125 on the capacitor insulating layer 127. A conventional lithographic process is then performed to form a patterned photoresist layer 170, which covers the memory area 104.

Figure 12:
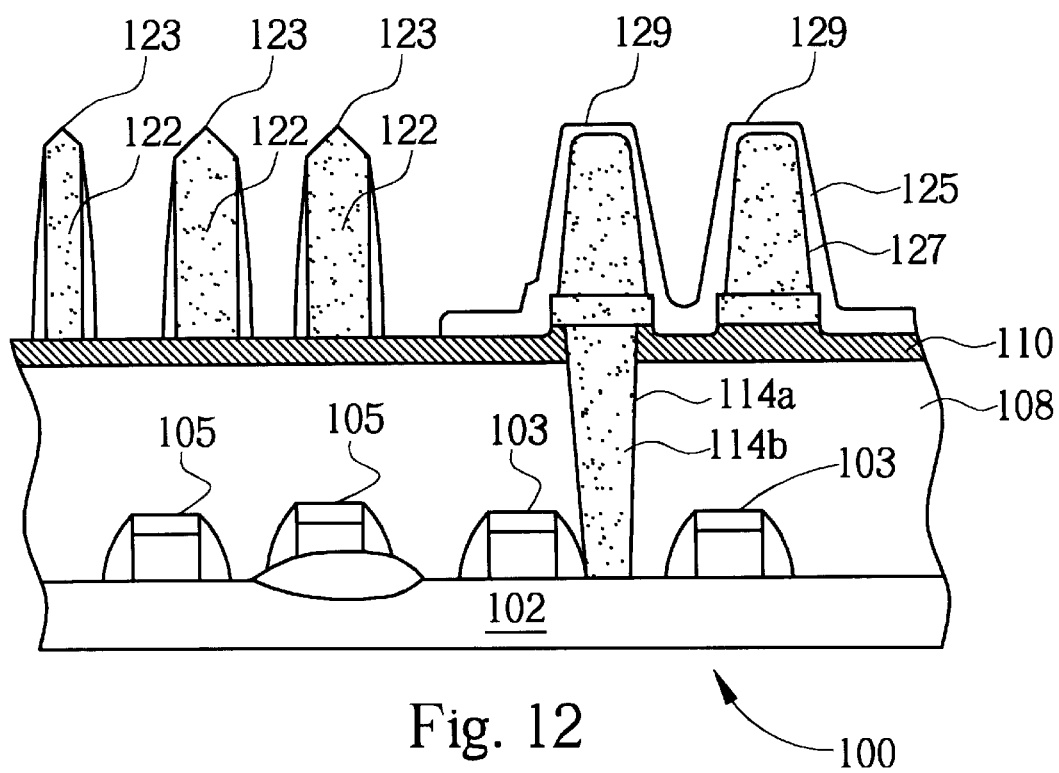

As shown in FIG. 12, a top electrode etch back process is next carried out to sharpen the dummy structures 122 so as to create a sharp structure 123. The sharp structures 123 are used to reduce the parasitic capacitance between the dummy structures 122 and an upper metal layer formed in the subsequent processes.

Figure 13:
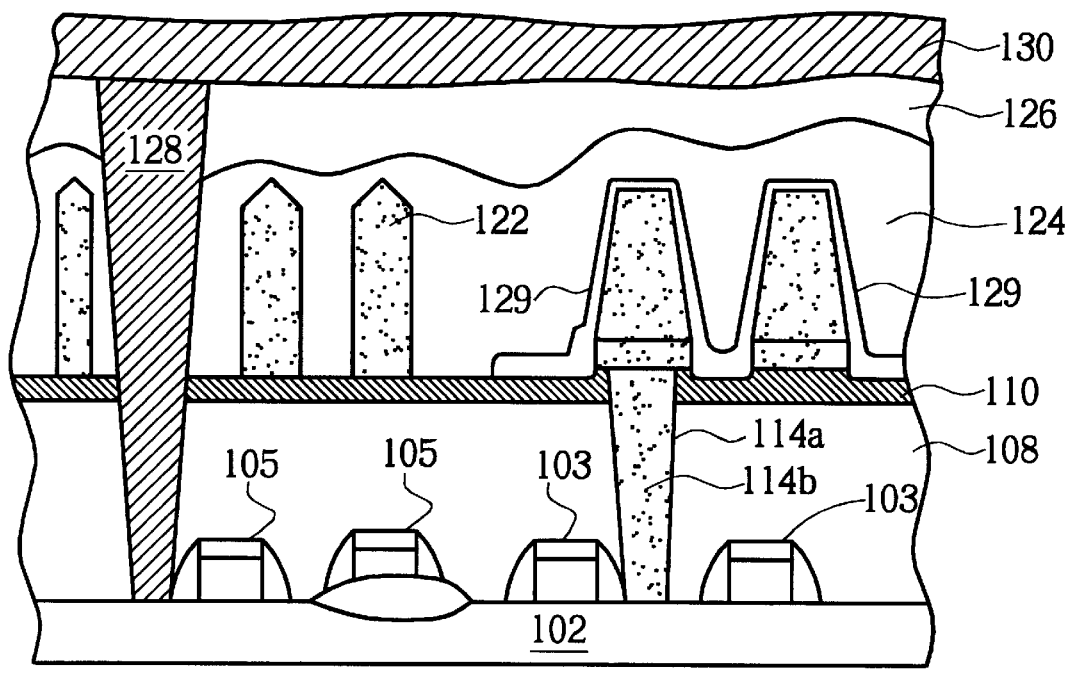

Referring to FIG. 13, a BPSG layer 124 with a predetermined thickness is next formed on the surface of the semiconductor wafer 100 by performing a conventional CVD process. To completely fill the spaces between the dummy structures 122, the predetermined thickness is preferably greater than the width of the spaces therein. At this stage, as shown in FIG. 13, the large step height of BPSG layer 124 between the memory region 104 and the logic region 106 no longer exists since the dummy structure 122 is approximately flush with the capacitor structures 129.

A dielectric layer 126 is thereafter formed over the BPSG layer 124. The dielectric layer 126 is composed of phosphosilicate glass (PSG), borophosphosilicate glass (BPSG), fluorinated silicon dioxide ($F_xSiO_y$), parylene, Teflon, or amorphous carbon. Next, similarly, using a dry etching process, a conventional metal CVD process and a metal CMP process, a contact plug 128 is formed in the dielectric layer 126, BPSG layer 124, AP oxide layer and PSG layer 108 over the logic region 106. Finally, metallization is carried out to form a metal layer 130 over the PSG layer 126.

Figure 14:
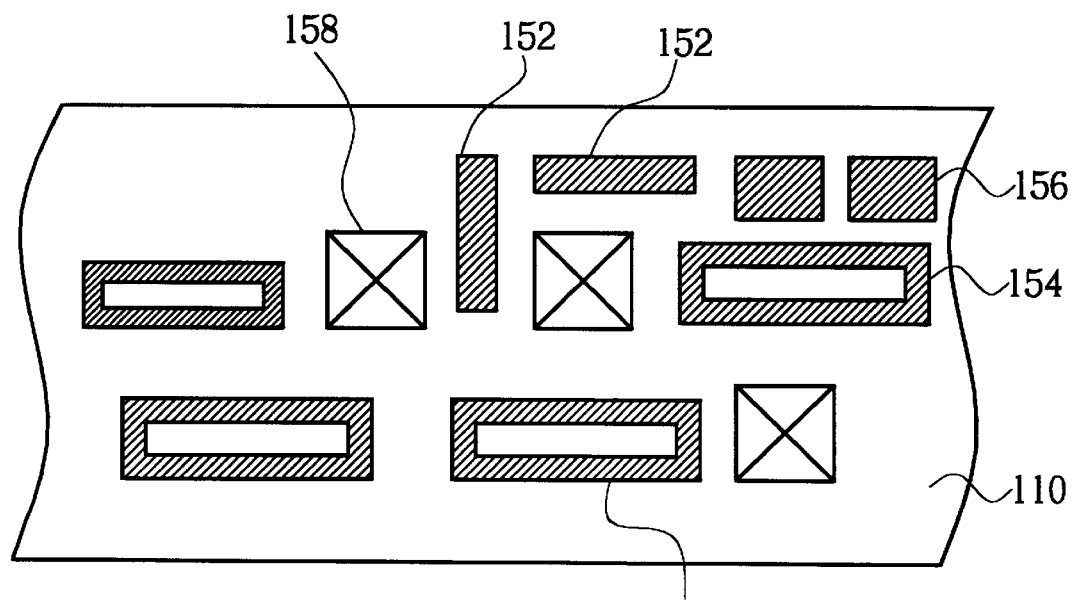
FIG. 14 is a top view of the defined dummy pattern over the logic region.

Refer now to FIG. 14. FIG. 14 depicts a top view of the patterned dummy structure 122 over the logic region 106. The dummy pattern as well as the pattern of the storage node 120 are designed simultaneously on the same photomask by virtue of a computer assisted design (CAD) system. As shown in FIG. 14, the top view of the dummy structures 122 may have a belt shape 152, a frame shape 154, a rectangular shape 156, or combinations of the three. It should be noted that the designed dummy pattern should avoid overlapping with the contact plug pattern 158. In addition, the width of the spacing between the dummy pattern is less than half the thickness of the BPSG layer 124 so that the BPSG layer 124 fills the spacing. Moreover, the dummy structures 122 can not only be positioned on top of the logic region 106, but they can also be formed on any non-memory region area.

Compared to the prior art method of fabricating EDRAM, the present invention has the following advantages: (1) the spacer used to release stress is omitted; (2) the additional BPSG layer and the subsequent etching process used to form the spacer are omitted; (3) deposition of the additional thick PSG layer is not required in the present invention; (4) an additional thermal re-flow process used to obtain a smoother PSG layer is also omitted; (5) an additional lithographic process and an etching process used to remove a predetermined thickness of the PSG layer over the memory region is also omitted; and (6) an extra-expensive CMP process is eliminated.

In conclusion, it is advantageous to use the present invention since the dummy structures 122 are formed over the logic region 106 on the AP oxide layer 110. The dummy structures 122 simplify the prior art method and maintain a high degree of planarity in the EDRAM. Furthermore, the present invention is an economical and efficient fabrication process because an extra CMP process and other processes in the prior art method are omitted.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for improving planarization of an inter layer dielectric (ILD) layer, the method comprising:
   providing a semiconductor wafer, at least one memory cell and one periphery area being defined on the surface of the semiconductor wafer;
   forming a first dielectric layer on the surface of the semiconductor wafer covering the memory cell area and the periphery area;
   forming a silicon layer over the first dielectric layer;
   forming at least one dummy pattern over the periphery area and a plurality of storage nodes over the memory cell area in the silicon layer;
   forming an insulating layer and a top electrode on each of the storage nodes; and
   forming a second dielectric layer on the surface of the semiconductor wafer that covers the top electrode and the dummy pattern.

2. The method of claim 1 further comprising an etch back process after forming the dummy pattern, the etch back process being used to sharpen the dummy pattern and simultaneously defining the top electrode.

3. The method of claim 1 further comprising the following steps after forming the second dielectric layer:
   forming a low-k material layer over the second dielectric layer; and
   performing a thermal flow process to create an approximately even surface on the low-k material layer.

4. The method of claim 3 wherein the low-k material is comprised of phosphosilicate glass (PSG), borophosphosilicate glass (BPSG), fluorinated silicon dioxide ($F_xSiO_y$), parylene, Teflon, or amorphous carbon.

5. The method of claim 1 wherein the thickness of the silicon layer ranges from 6000 to 8000 angstroms.

6. The method of claim 1 wherein the dummy pattern is approximately flush with the storage nodes.

7. The method of claim 1 wherein the first dielectric layer is an AP oxide layer.

8. The method of claim 1 wherein the second dielectric layer is composed of BPSG.

9. The method of claim 1 wherein the silicon layer is composed of polysilicon or amorphous silicon.

10. The method of claim 1 wherein the width of the spacing between the dummy pattern is less than half the thickness of the second dielectric layer so that the second dielectric layer fills the spacing.

11. The method of claim 1 wherein the dummy pattern and the storage nodes are formed simultaneously using a lithographic process and an etching process.

12. A method for improving planarization of an inter layer dielectric (ILD) layer during an embedded DRAM manufacturing process, the method comprising:
   providing a semiconductor wafer, at least one memory cell and one periphery area being defined on the surface of the semiconductor wafer;
   forming an AP oxide layer on the semiconductor wafer that covers the memory cell area and the periphery area;
   forming a silicon layer over the AP oxide layer;
   performing a lithographic process and an etching process to simultaneously form at least one dummy pattern and a plurality of storage nodes over the periphery area and memory cell area respectively in the silicon layer;
   forming an insulating layer and a top electrode on each of the storage nodes;
   performing an etch back process to create a sharp structure on the dummy pattern and simultaneously defining the top electrode; and forming a dielectric layer on the surface of the semiconductor wafer that covers the top electrode and the dummy pattern, the dielectric layer filling a spacing between the dummy pattern;

wherein the width of the spacing between the dummy pattern is less than half the thickness of the dielectric layer.

13. The method of claim 12 further comprising the following steps after forming the dielectric layer:

forming a low-k material layer over the dielectric layer; and performing a thermal flow process to create an approximately even surface on the low-k material layer.

14. The method of claim 13 wherein the low-k material is comprised of phosphosilicate glass (PSG), borophosphosilicate glass (BPSG), or fluorinated silicon dioxide ($F_xSiO_y$).

15. The method of claim 12 wherein the thickness of the silicon layer ranges from 6000 to 8000 angstroms.

16. The method of claim 12 wherein the top of the dummy pattern is approximately flush with the storage nodes.

17. The method of claim 12 wherein the silicon layer is composed of polysilicon or amorphous silicon.

18. The method of claim 12 wherein the dielectric layer is composed of BPSG.

* * * * *